(12) United States Patent
Liu et al.

(10) Patent No.: US 9,653,579 B2
(45) Date of Patent: May 16, 2017

(54) METHOD FOR MAKING SEMICONDUCTOR DEVICE WITH FILLED GATE LINE END RECESSES

(71) Applicants: STMICROELECTRONICS, INC., Coppell, TX (US); GLOBALFOUNDRIES Inc, Grand Cayman (KY); INTERNATIONAL BUSINESS MACHINES CORPORATION, Armonk, NY (US)

(72) Inventors: Qing Liu, Watervliet, NY (US); Ruilong Xie, Schenectady, NY (US); Xiuyu Cai, Niskayuna, NY (US); Chun-chen Yeh, Clifton Park, NY (US); Kejia Wang, Poughkeepsie, NY (US)

(73) Assignees: STMicroelectronics, Inc., Coppell, TX (US); GLOBALFOUNDRIES Inc, Grand Cayman (KY); International Business Machines Corporation, Armonk, NY (US)

( * ) Notice: Subject to any disclaimer, the term of this patent is extended or adjusted under 35 U.S.C. 154(b) by 28 days.

(21) Appl. No.: 14/281,021

(22) Filed: May 19, 2014

(65) Prior Publication Data
US 2015/0333155 A1    Nov. 19, 2015

(51) Int. Cl.
| H01L 21/336 | (2006.01) |
| H01L 29/66 | (2006.01) |
| H01L 21/8234 | (2006.01) |
| H01L 27/088 | (2006.01) |
| H01L 29/417 | (2006.01) |

(52) U.S. Cl.
CPC .. *H01L 29/66795* (2013.01); *H01L 29/66545* (2013.01); *H01L 21/823431* (2013.01); *H01L 21/823437* (2013.01); *H01L 27/0886* (2013.01); *H01L 29/41791* (2013.01)

(58) Field of Classification Search
CPC ..... H01L 21/823821; H01L 21/823431; H01L 29/66545; H01L 29/66795
USPC ........................................................ 438/262
See application file for complete search history.

(56) References Cited

U.S. PATENT DOCUMENTS

| 2012/0326241 A1* | 12/2012 | Haran | ............... H01L 21/28518 |
| | | | 257/401 |
| 2013/0037886 A1* | 2/2013 | Tsai | .................. H01L 21/82382 |
| | | | 257/351 |

\* cited by examiner

*Primary Examiner* — Matthew Gordon
(74) *Attorney, Agent, or Firm* — Seed IP Law Group LLP

(57) ABSTRACT

A method for making a semiconductor device may include forming first and second spaced apart semiconductor active regions with an insulating region therebetween, forming at least one sacrificial gate line extending between the first and second spaced apart semiconductor active regions and over the insulating region, and forming sidewall spacers on opposing sides of the at least one sacrificial gate line. The method may further include removing portions of the at least one sacrificial gate line within the sidewall spacers and above the insulating region defining at least one gate line end recess, filling the at least one gate line end recess with a dielectric material, and forming respective replacement gates in place of portions of the at least one sacrificial gate line above the first and second spaced apart semiconductor active regions.

19 Claims, 17 Drawing Sheets

METHOD FOR MAKING SEMICONDUCTOR DEVICE WITH FILLED GATE LINE END RECESSES

FIELD OF THE INVENTION

The present invention relates to the field of electronic devices and, more particularly, to semiconductor devices and related methods.

BACKGROUND OF THE INVENTION

Fin-based field effect transistors (FINFETs) are vertical transistor devices in which a semiconductor fin is located on a substrate and is used to define the source, drain, and channel regions of the device. The gate structure overlies the fin in the channel area, and in some configurations multiple fins may be used to provide a multi-gate transistor architecture. The multiple gates may be controlled by a single gate electrode, where the multiple gate surfaces act electrically as a single gate, or by independent gate electrodes.

With ever-increasing device integration densities, (e.g., 10 nm and beyond), various challenges may arise with respect to both FINFET and planar semiconductor devices. For example, with increasing densities, the distances between adjacent devices becomes smaller, making the chances for inadvertent shorting between adjacent contacts greater. As such, further enhancements in semiconductor devices may be desirable in some applications, such as next generation FINFET or planar devices with relatively small dimensions, for example.

SUMMARY OF THE INVENTION

A method for making a semiconductor device may include forming first and second spaced apart semiconductor active regions with an insulating region therebetween, forming at least one sacrificial gate line extending between the first and second spaced apart semiconductor active regions and over the insulating region, and forming sidewall spacers on opposing sides of the at least one sacrificial gate line. The method may further include removing portions of the at least one sacrificial gate line within the sidewall spacers and above the insulating region defining at least one gate line end recess, filling the at least one gate line end recess with a dielectric material, and forming respective replacement gates in place of portions of the at least one sacrificial gate line above the first and second spaced apart semiconductor active regions.

By way of example, the dielectric material may comprise a nitride. In accordance with one example embodiment, the dielectric material may include an outer liner comprising a nitride, an inner liner comprising a first oxide, and a second oxide within the inner liner different than the first oxide. By way of example, the first oxide may comprise hafnium oxide, and the second oxide may comprise silicon dioxide. The at least one sacrificial gate line may include a plurality of spaced apart sacrificial gate lines extending between the first and second spaced apart semiconductor active regions.

Additionally, the method may also include forming oxide regions adjacent the at least one sacrificial gate line above the insulating region after forming the sidewall spacers. Furthermore, a plurality of epitaxial regions may be formed adjacent the at least one sacrificial gate liner over the semiconductor active regions. By way of example, the insulating region may be a shallow trench isolation (STI) region. The method may further include performing a self-aligned contact etch to remove portions of the dielectric material, and forming a contact line in place of the removed portions of the dielectric material and adjacent the replacement gates.

A related semiconductor device may include first and second spaced apart semiconductor active regions with an insulating region therebetween, and at least one respective gate above the first and second spaced apart semiconductor active regions and defining a gate end line recess therebetween over the insulating region. The semiconductor device may also include a dielectric body in the end line recess above the insulating region and comprising a different material than the insulating region.

DETAILED DESCRIPTION

Figure 1:
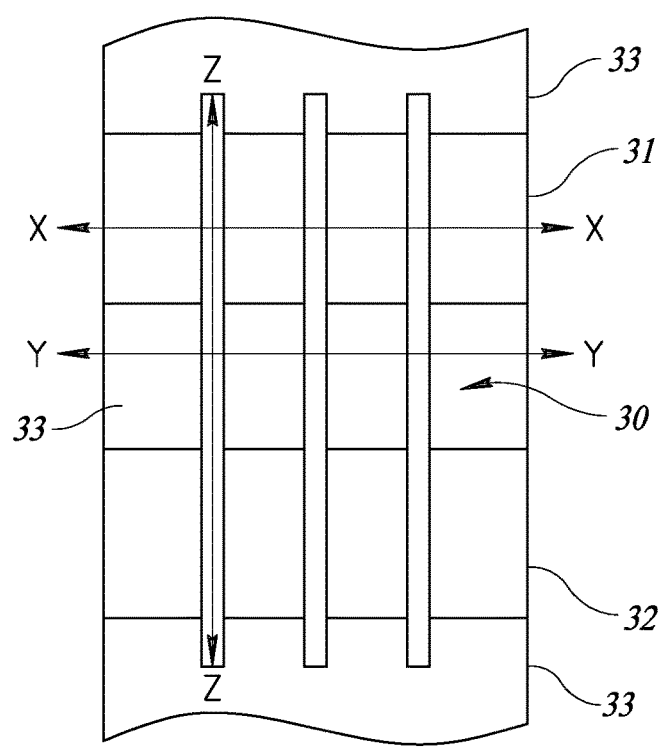
FIG. 1 is a top plan view illustrating a method for making a semiconductor device.
Figure 2:
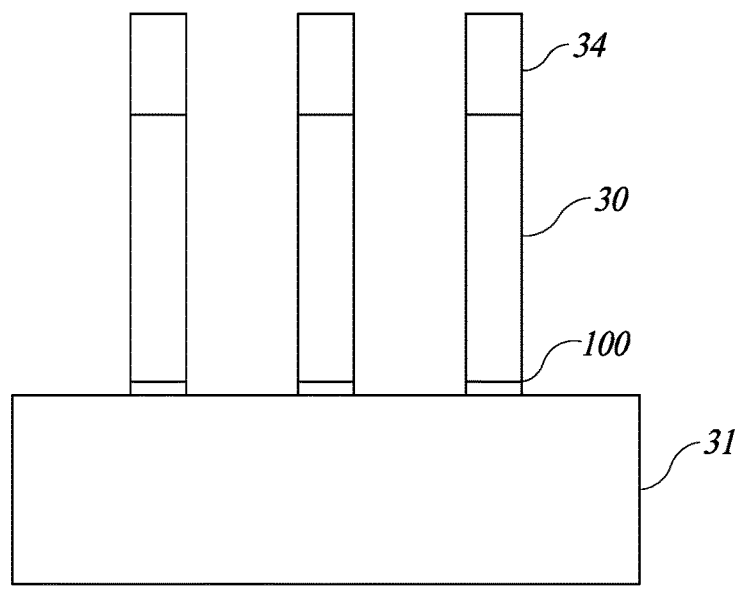
FIGS. 2-4 are cross-sectional views taken along lines X-X, Y-Y, and Z-Z in FIG. 1, respectively.
Figure 3:
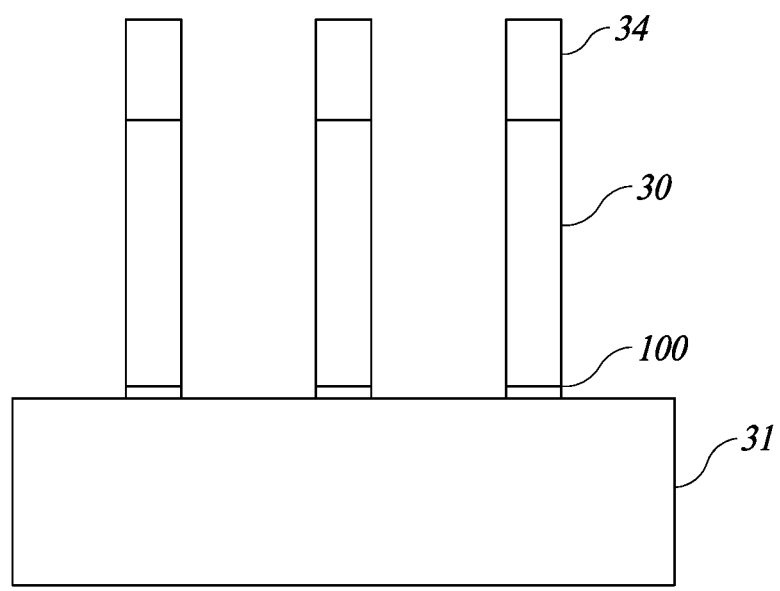
Figure 4:
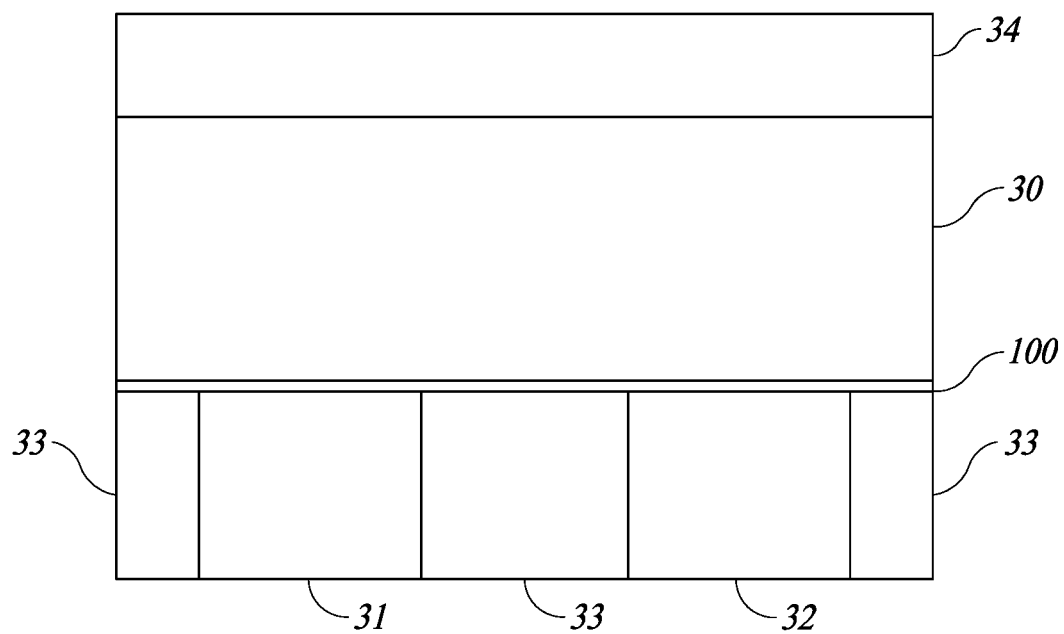

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similarly elements in different embodiments.

Referring initially to FIGS. 1-4, by way of background, sacrificial gate lines 30 (also referred to as a "PC lines") are used in FINFET integration. Due to the thinning of spacers at sacrificial gate line 30 ends where the PC lines are "cut" in between active semiconductor areas 31, 32 in typical integration approaches, defects may result from epitaxial deposition for source/drain regions. The area between the active regions 31, 32 may be an insulating region 33, such as a shallow trench isolation (STI) region, for example. Also, because of the thinning of spacers at the sacrificial gate line 30 ends, the contact reactive ion etch (RIE) may penetrate through and reach the sacrificial gate line 30, causing shorting between source/drain contacts and the sacrificial gate line 30 end. The approaches set forth herein may advantageously help protect the sacrificial gate line 30 ends from such problems. An optional layer 100 may be formed between gate line 30 and the active regions 31, 32 and between the gate line 30 and the insulating region 33.

Each of the sacrificial gate lines 30 are formed using a nitride hard mask 34 to cover the areas where the sacrificial gate lines are to remain after etching of the adjacent semiconductor material (e.g., through RIE, etc.). The sacrificial gate lines 30 extend between the spaced apart semiconductor active regions 31, 32 and over the intervening insulating region 33. By way of example, the semiconductor gate line material may be amorphous silicon, although other suitable semiconductors may be used in different embodiments. The active regions 31, 32 may be used to implement planar devices, FINFET devices, nanowire devices, etc., as will be appreciated by those skilled in the art.

Figure 5:
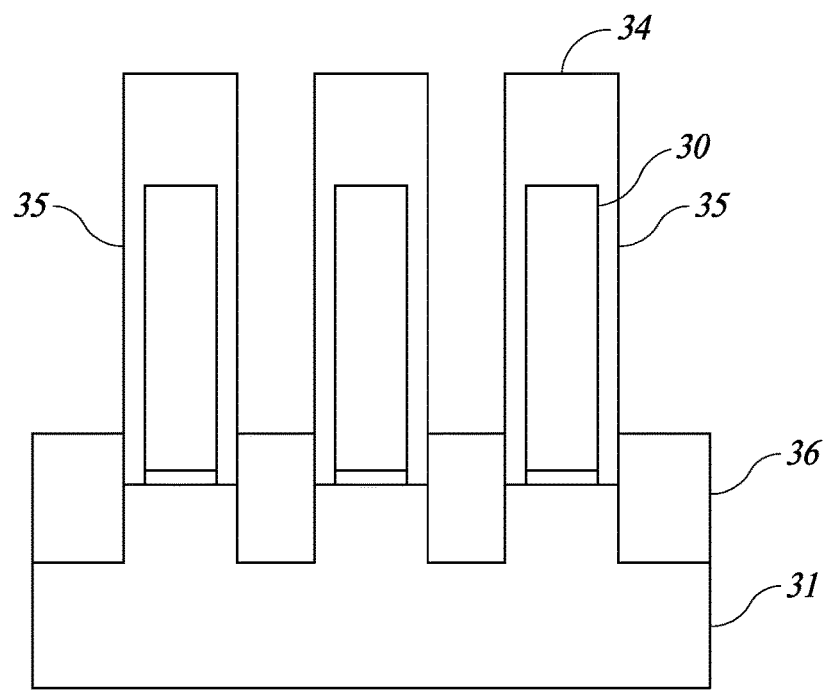
FIGS. 5-7 are cross-sectional views similar to FIGS. 2-4, respectively, after sidewall spacer formation.
Figure 6:
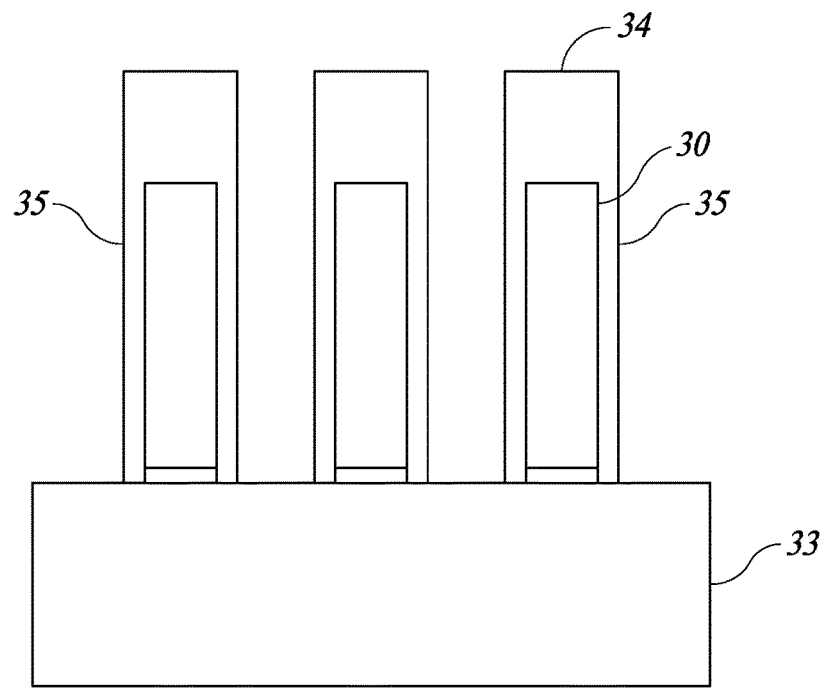
Figure 7:
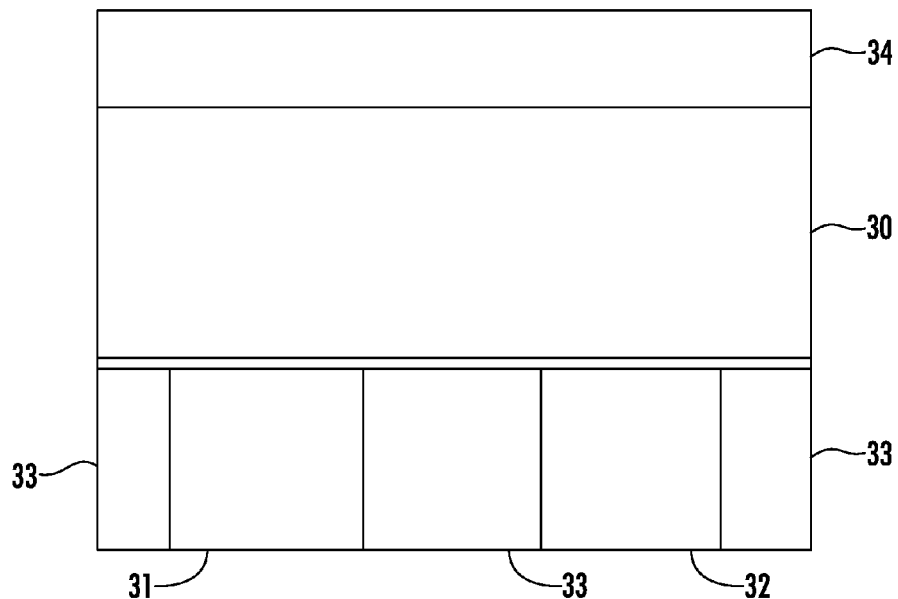

Referring additionally to FIGS. 5-7, sidewall spacers 35 may formed on opposing sides of the sacrificial gate lines 30. By way of example, the sidewall spacers 35 may be silicon nitride spacers, for example. Furthermore, epitaxial growth of source/drain regions 36 (e.g., epitaxial silicon) may be performed after formation of the sidewall spacers 35. Doing so—as opposed to attempting to cut or sever the sacrificial gate lines 30 over the STI region 33 prior to formation of the epitaxial regions 36 at this point in the process—advantageously helps keep the line ends from being shorted by the epitaxial deposition, as will be appreciated by those skilled in the art.

Figure 8:
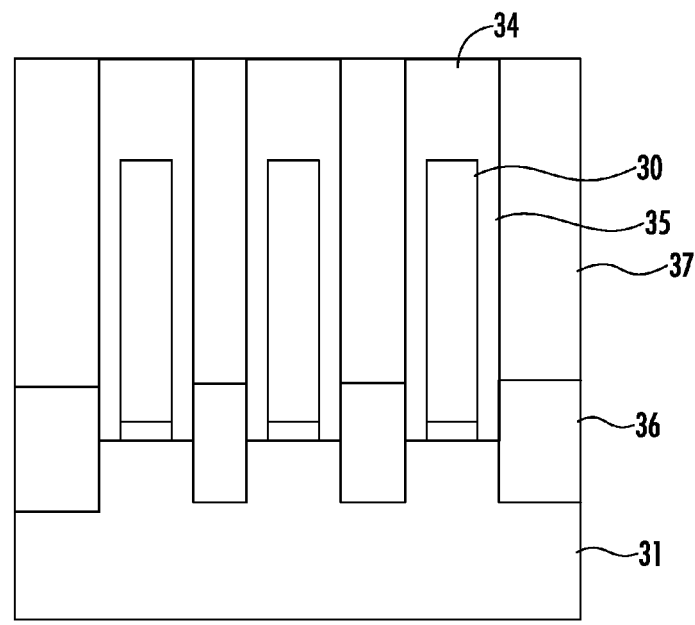
FIGS. 8-10 are cross-sectional views similar to FIGS. 5-7, respectively, after an oxide fill.
Figure 9:
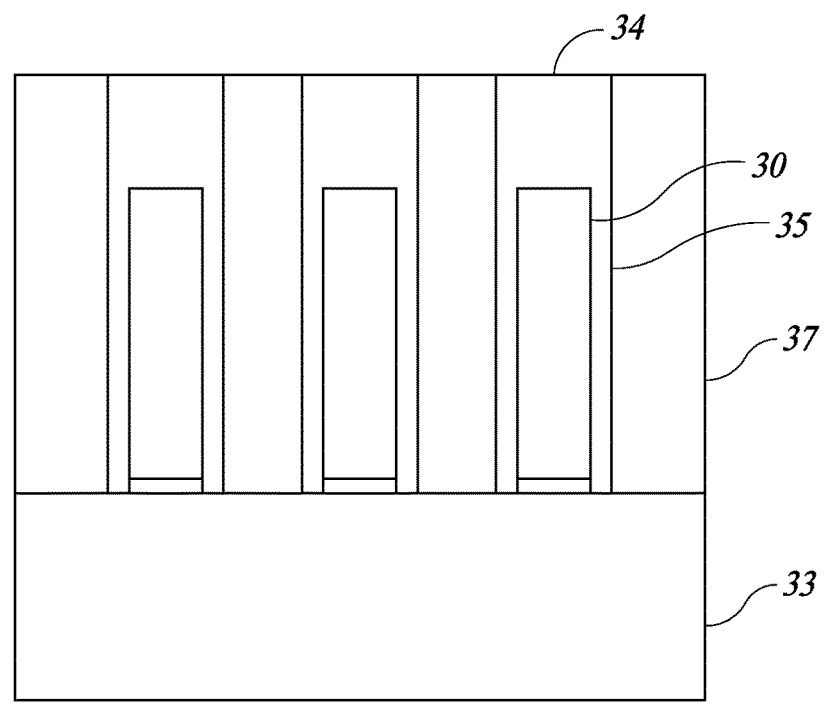
Figure 10:
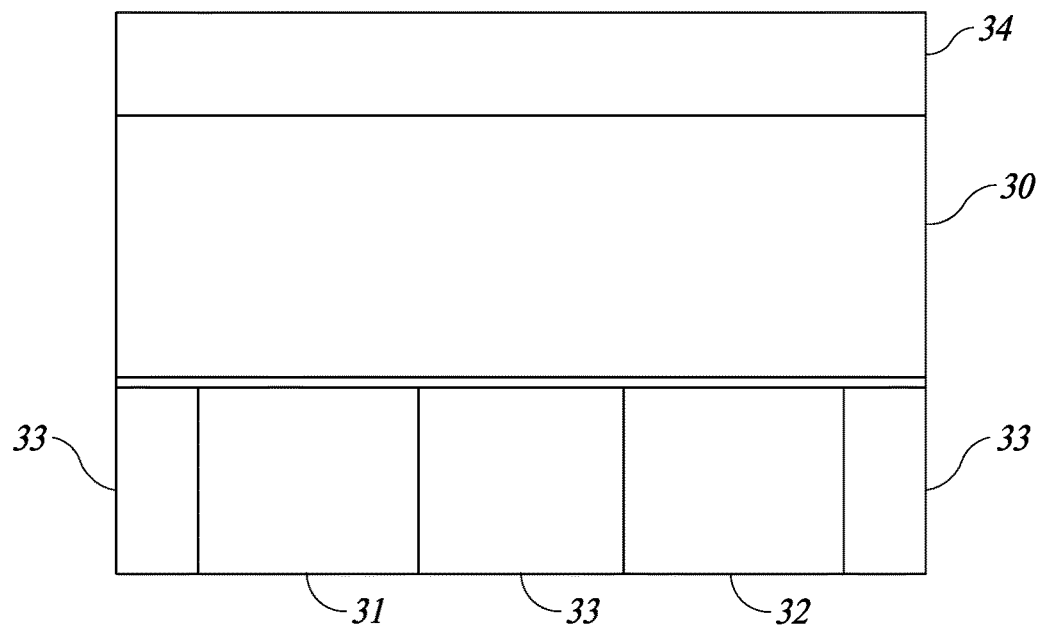
Figure 11:
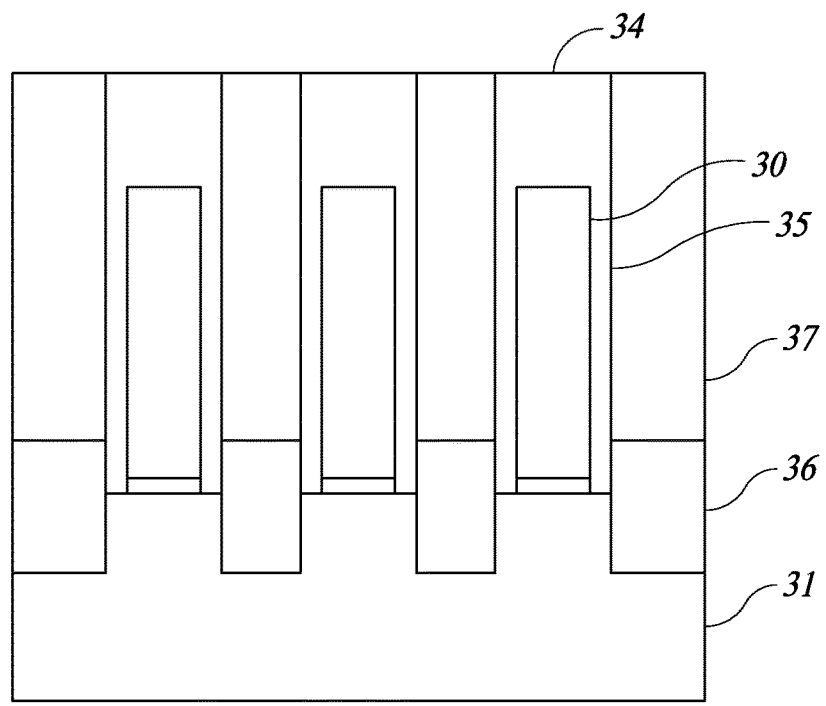
FIGS. 11-13 are cross-sectional views similar to FIGS. 5-7, respectively, after removal of nitride hard mask portions.
Figure 12:
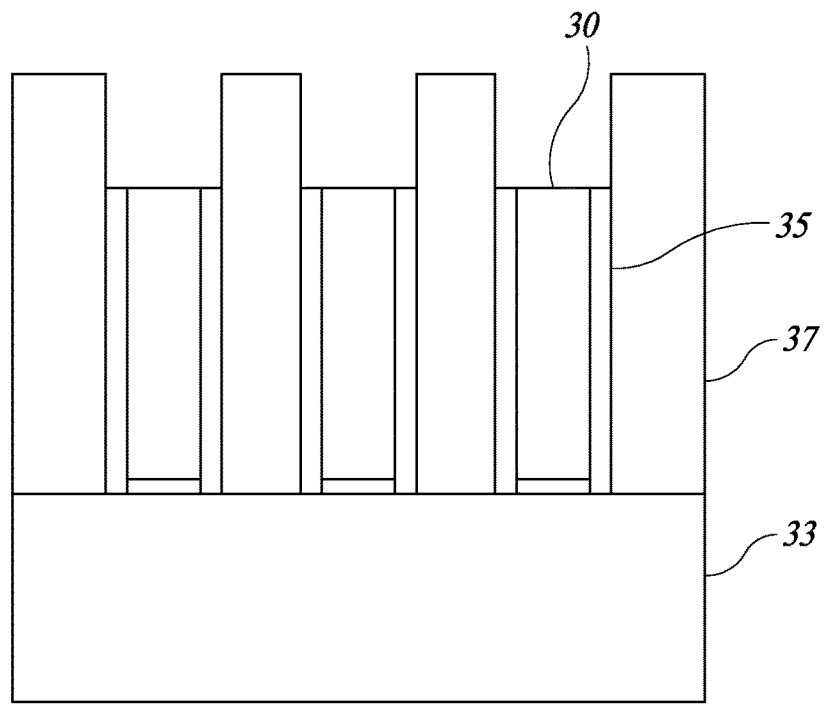
Figure 13:
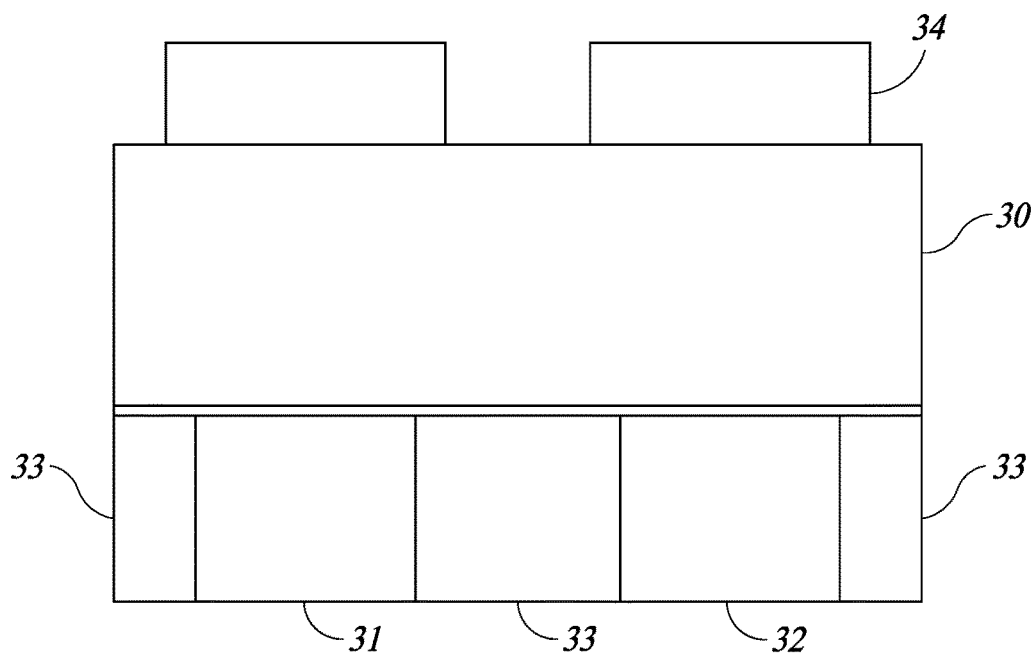
Figure 14:
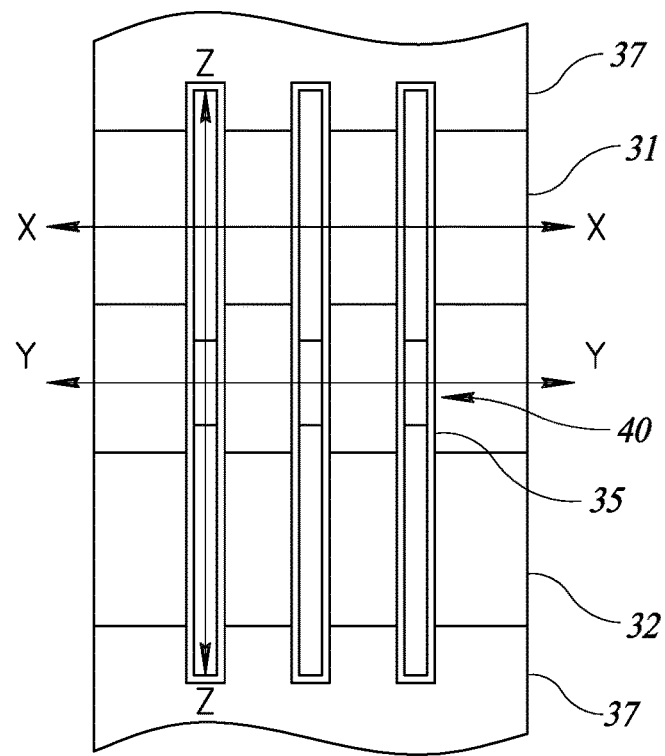
FIG. 14 is a top plan view similar to FIG. 1 after removal of sacrificial gate line portions.
Figure 15:
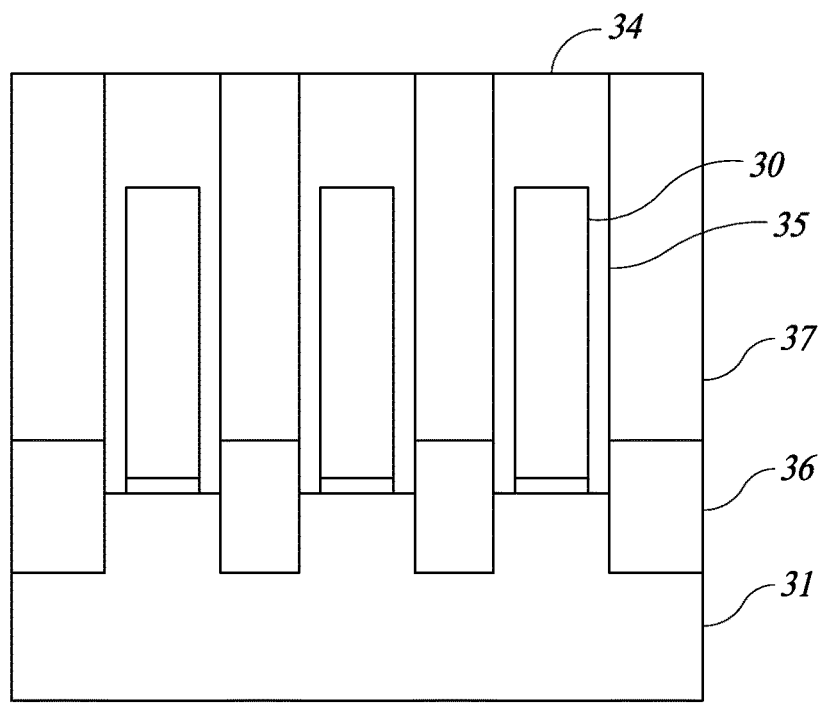
FIGS. 15-17 are cross-sectional views taken along lines X-X, Y-Y, and Z-Z in FIG. 14, respectively.
Figure 16:
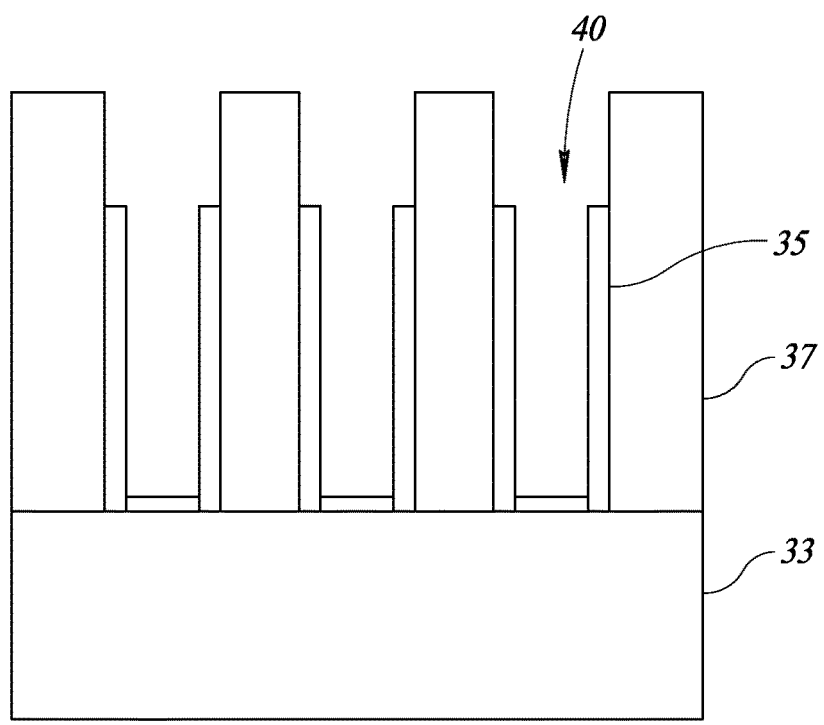
Figure 17:
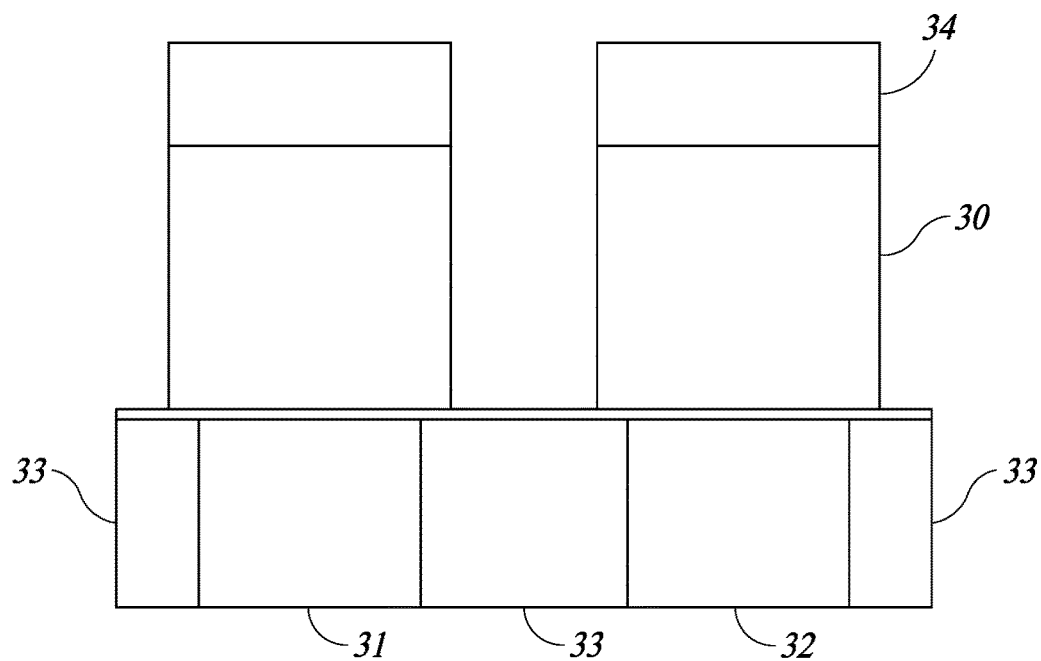
Figure 18:
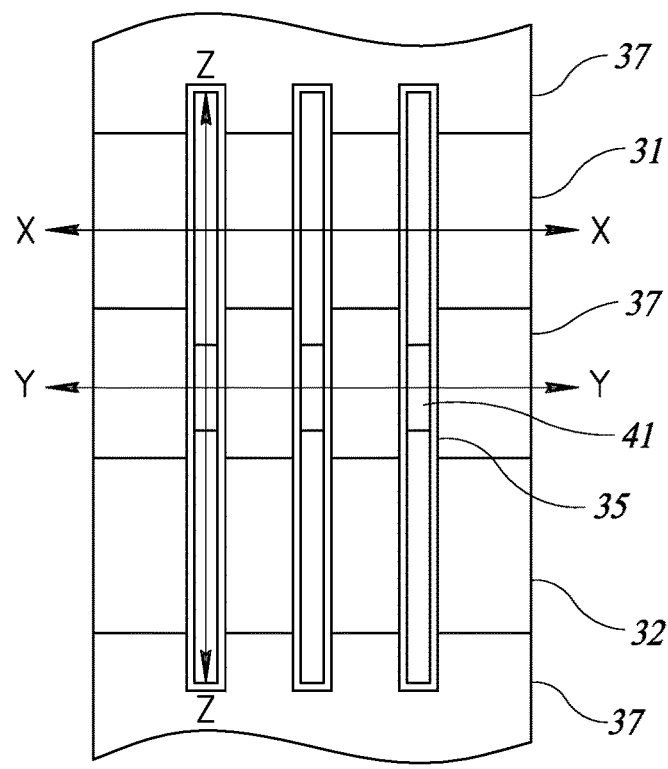
FIG. 18 is a top plan view similar to FIG. 14 after gate line end recess filling.
Figure 19:
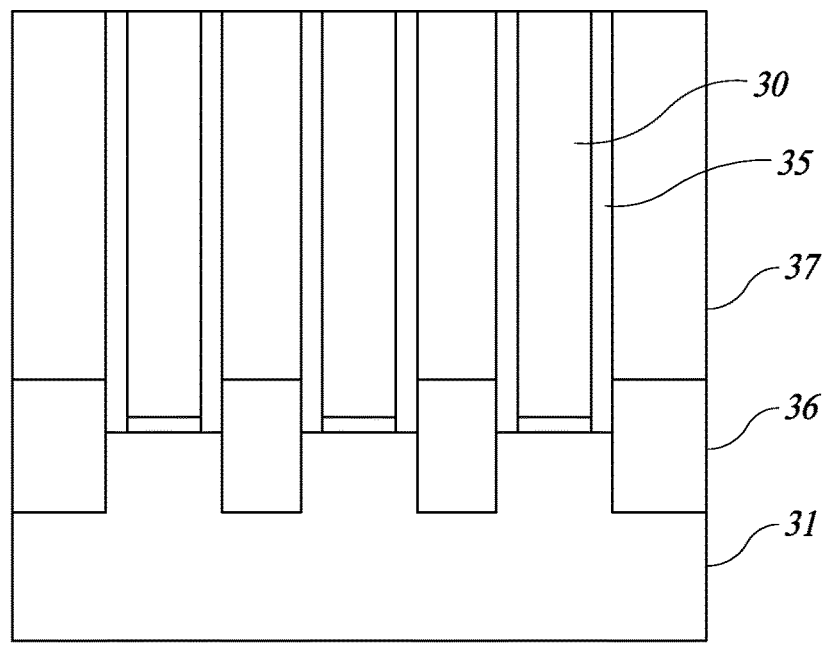
FIGS. 19, 20, and 22 are cross-sectional views taken along lines X-X, Y-Y, and Z-Z in FIG. 18, respectively.

Referring to FIGS. 8-10, an oxide 37 (e.g., $SiO_2$) may be formed to fill between adjacent spacers 35 and sacrificial gate lines 30, followed by a planarizing step (e.g., chemical mechanical polishing (CMP)) to planarize the oxide at the surface level of the nitride mask 34. Furthermore, portions of the SiN hard mask 34 covering the sacrificial gate lines 30 over the STI region 33 between the active regions 31, 32 may then be removed to expose the sacrificial gate lines where they are to be "cut" or separated, as seen in FIGS. 11-13.

Figure 20:
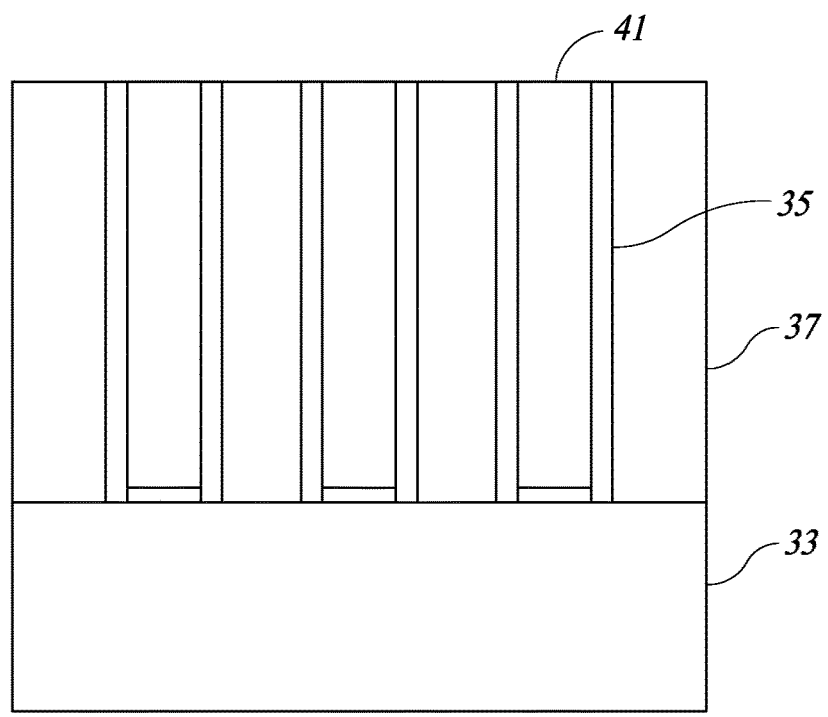
Figure 21:
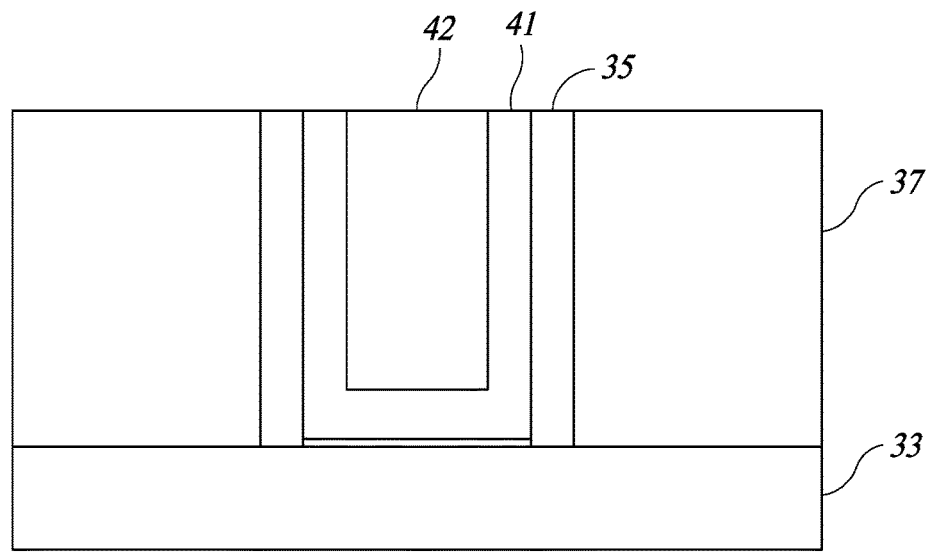
FIG. 21 is a cross-sectional view similar to that of FIG. 20 but for a larger gate line end recess.
Figure 22:
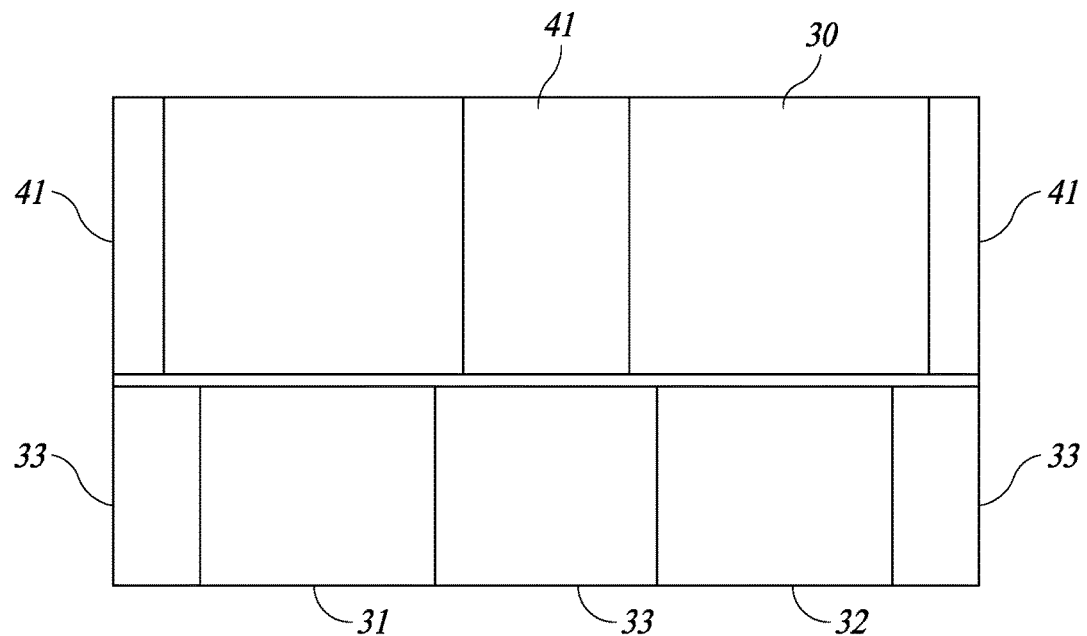
Figure 23:
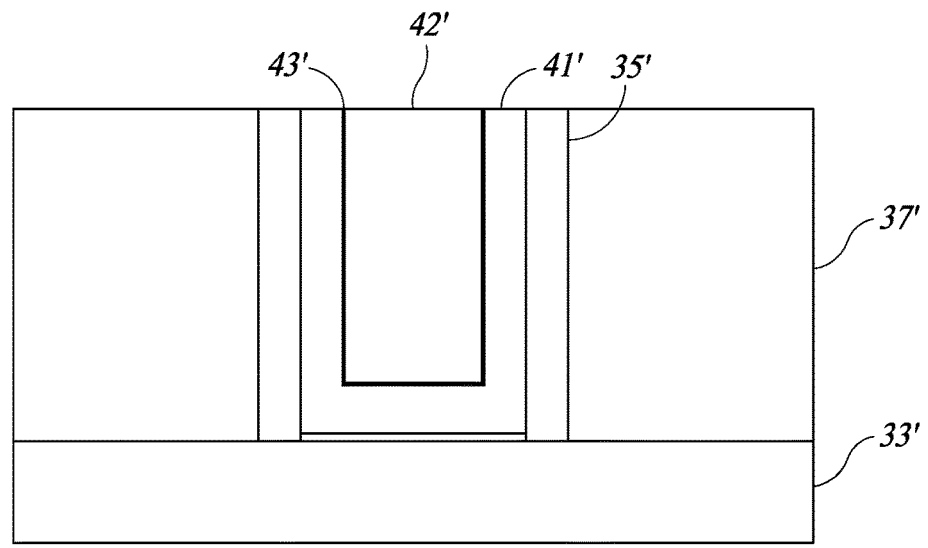
FIGS. 23-24 are cross-sectional views of another embodiment taken along lines Y-Y, and Z-Z in FIG. 18 including a hafnium oxide liner in the gate line end recess.
Figure 24:
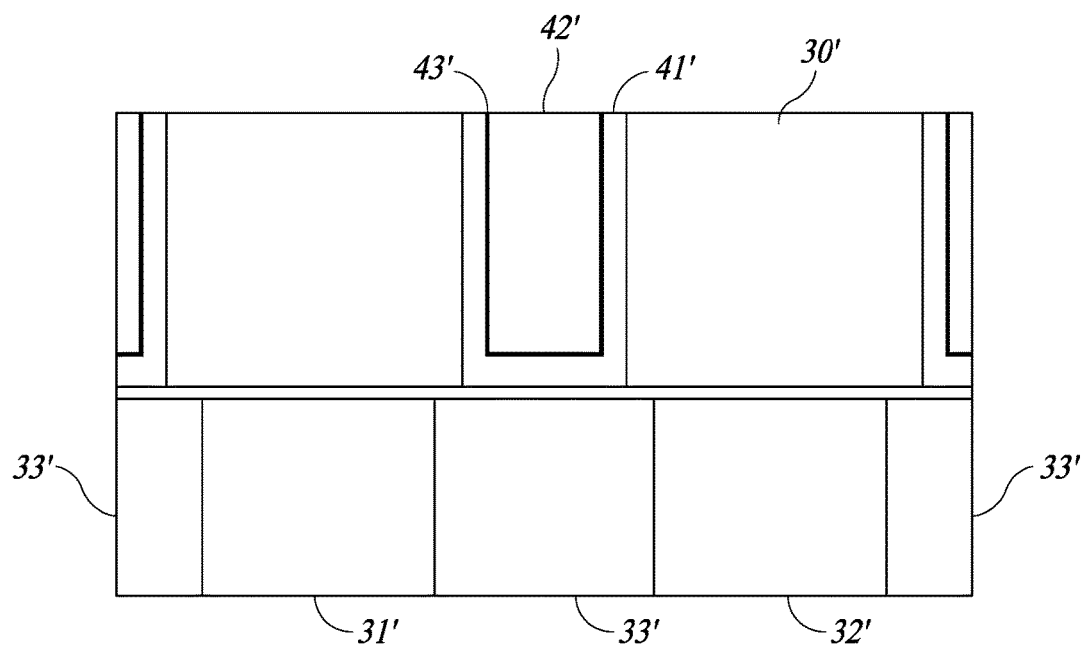

With reference to FIGS. 14-17, the exposed portions of the sacrificial gate lines 30 within the sidewall spacers 35 and above the insulating region 33 between the first and second active regions 31, 32 may be removed to define gate line end recesses 40. This severs or cuts the sacrificial gate lines 30 so that there is no longer a connection across the insulating region 33. Referring additionally to FIGS. 18-22, the gate line end recesses 40 may then be filled with a dielectric material 41, such as silicon nitride in the illustrated example (FIG. 20). In some embodiments, such as for relatively large node implementations or for larger devices present on the same wafer, a larger gate line end recess 40 may be created from the larger sacrificial gate line 30, in which the silicon nitride 41 may be a liner within the recess, and another dielectric material 42 (e.g., $SiO_2$) may be filled within the nitride liner, as shown in FIG. 21. CMF processing may also be used to planarize down to the level of the sacrificial gate line 30 portions.

In accordance with another example embodiment shown in FIGS. 23-34, a different configuration may be used for the gate line end recess 40 fill. Here, the fill includes an outer nitride (e.g., SiN) liner 41', an inner liner 43' of a first oxide (e.g., hafnium oxide, $HfO_2$), and a second oxide 42' (e.g., $SiO_2$) within the inner liner. It should be noted, however, that in the above-described embodiments, different liner materials may be used in place of SiN (e.g., SiBCN, SiOCN, etc.) and $HfO_2$ (e.g., $HfSiO_x$, $Al_2O_3$, etc.). Moreover, while the examples used herein are silicon devices, it will be appreciated that the techniques presented may be used with other semiconductor configurations, including silicon germanium, III-V materials, etc.

Figure 25:
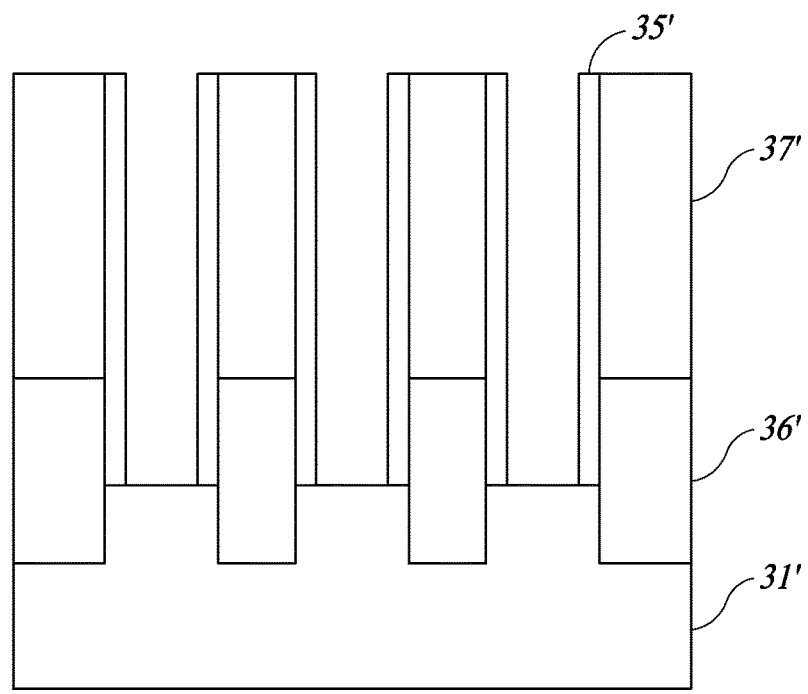
FIGS. 25-27 are cross-sectional views taken along lines X-X, Y-Y, and Z-Z in FIG. 18 of the hafnium oxide liner embodiment after removal of sacrificial gate line portions over the active regions.
Figure 26:
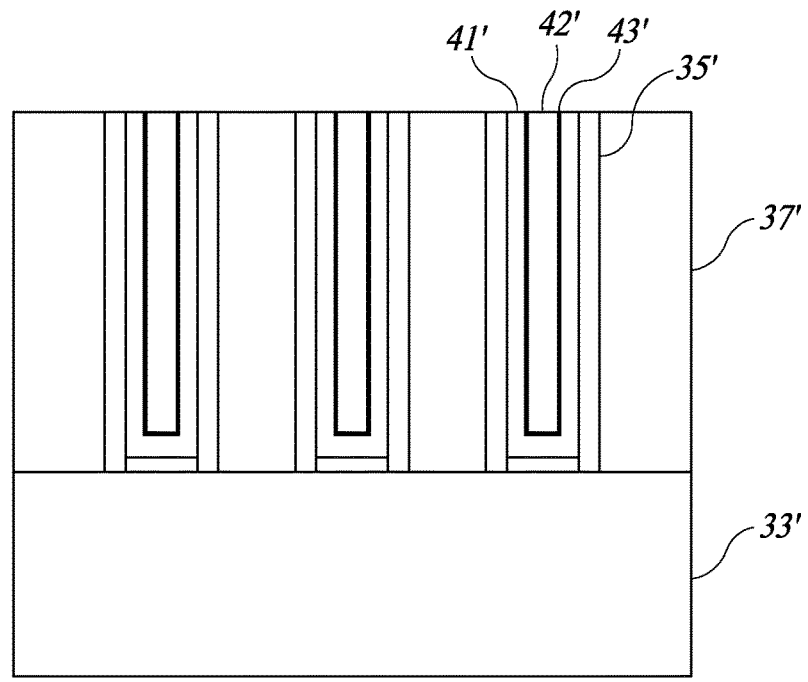
Figure 27:
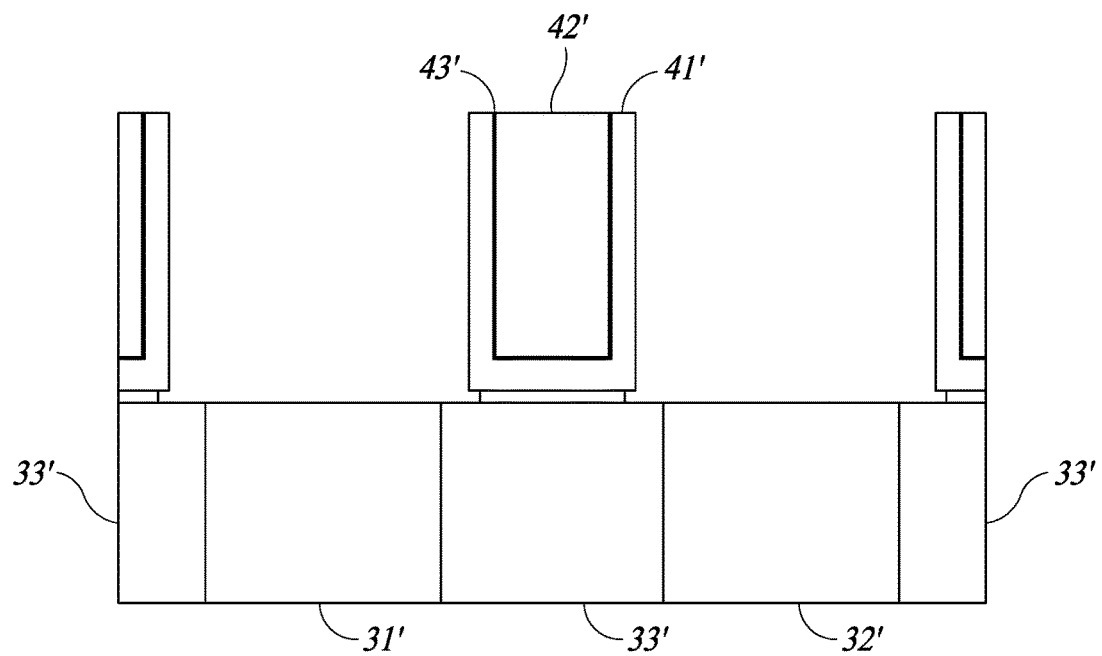
Figure 28:
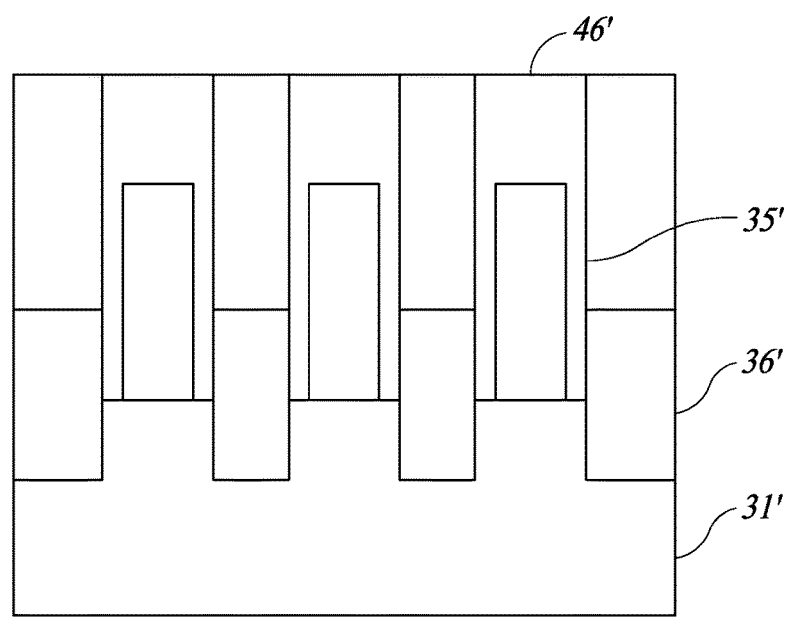
FIGS. 28-30 are cross-sectional views taken along lines X-X, Y-Y, and Z-Z in FIG. 18 of the hafnium oxide liner embodiment after formation of replacement gates.
Figure 29:
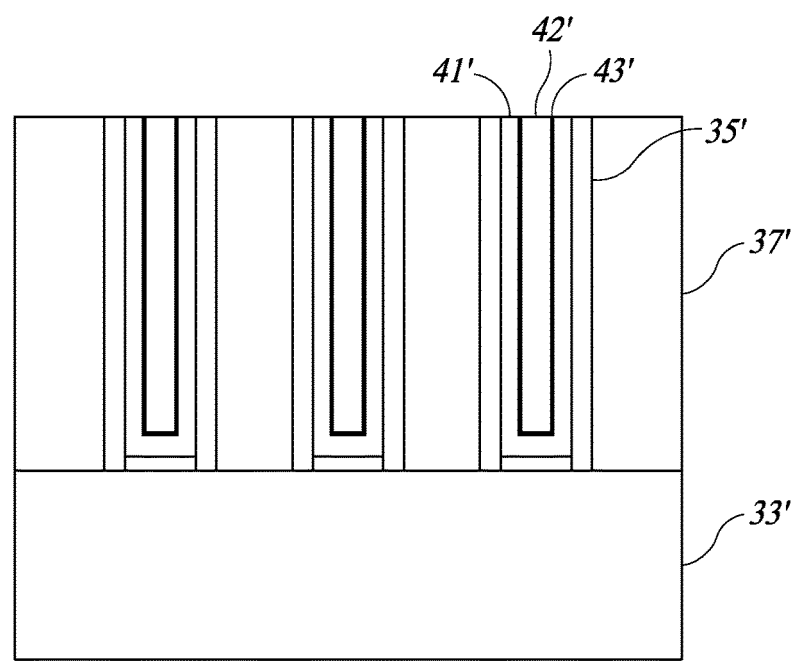
Figure 30:
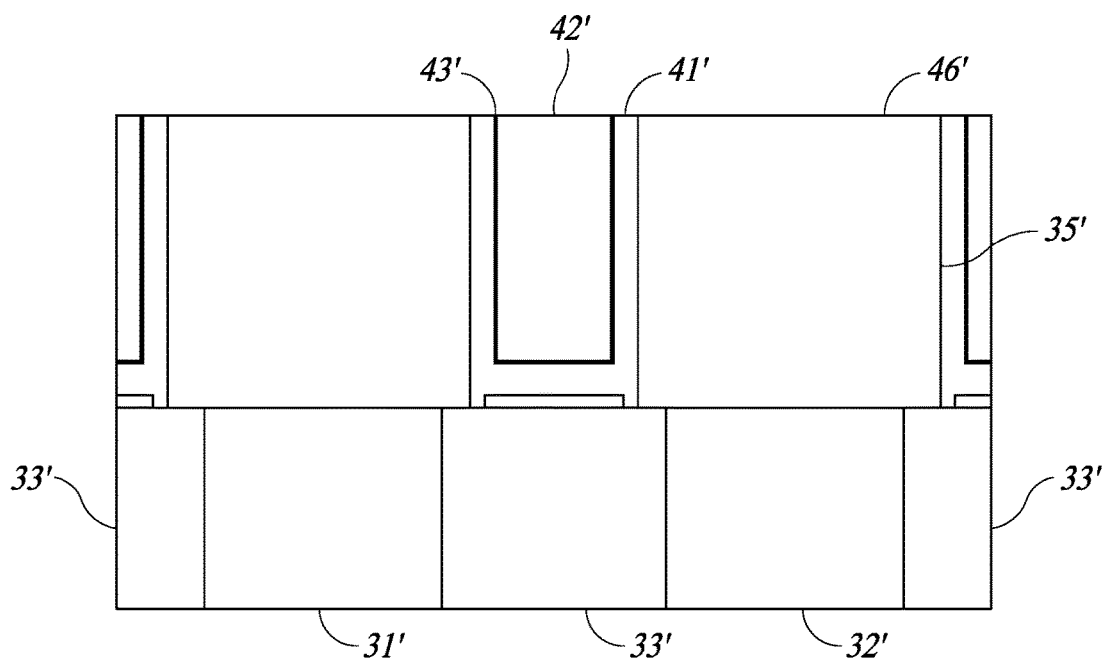
Figure 31:
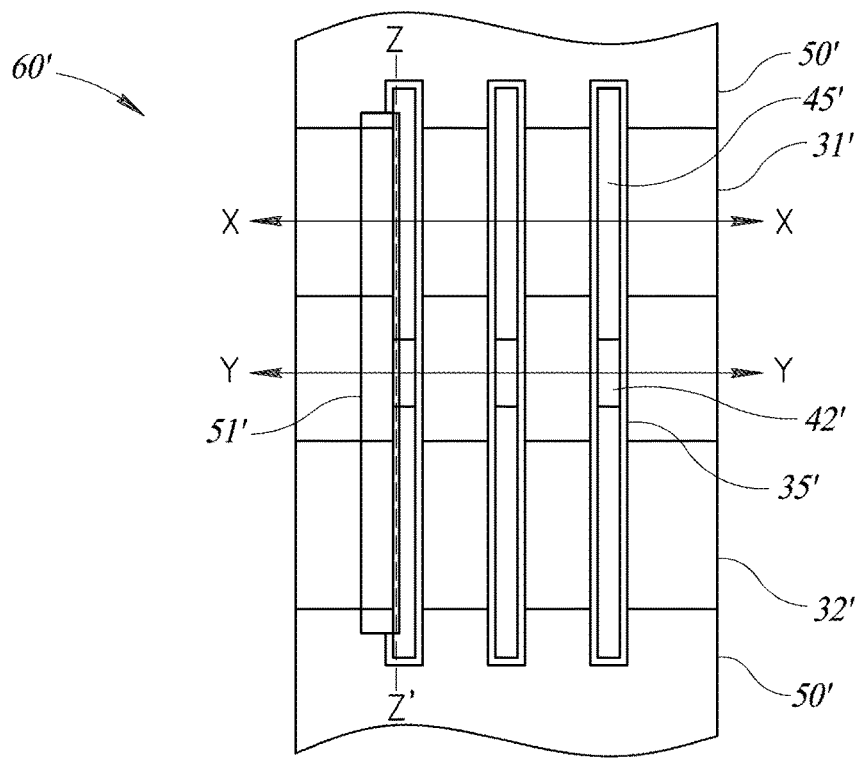
FIG. 31 is a top plan view similar to FIG. 18 after self aligned contact formation for the hafnium oxide liner embodiment.
Figure 32:
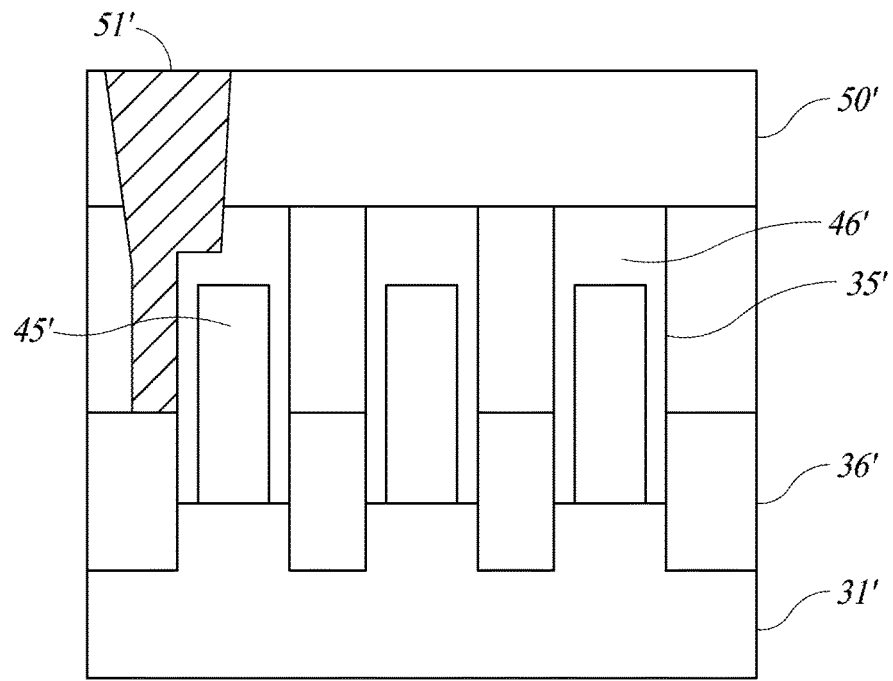
FIGS. 32-34 are cross-sectional views respectively taken along lines X-X, Y-Y, and Z-Z in FIG. 31.
Figure 33:
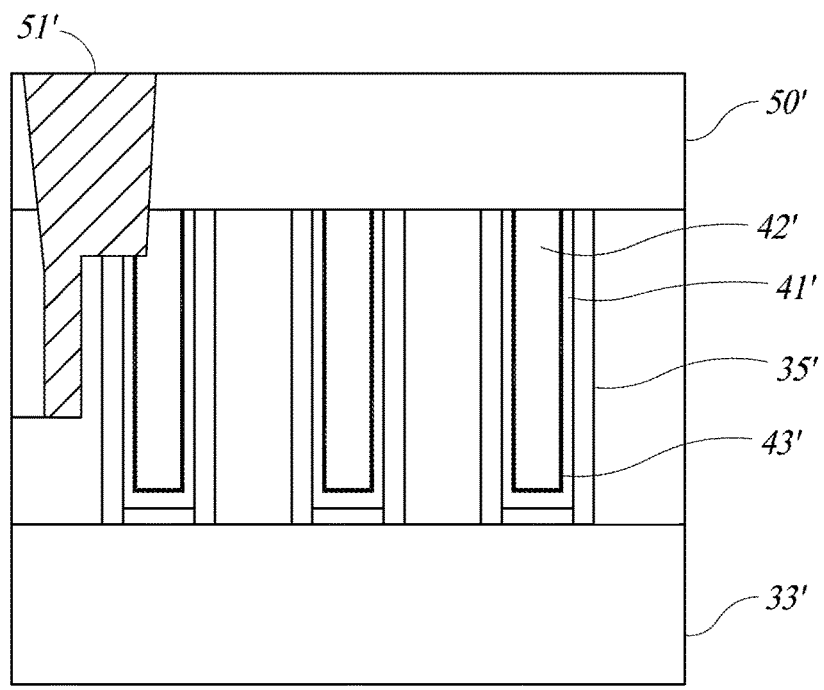
Figure 34:
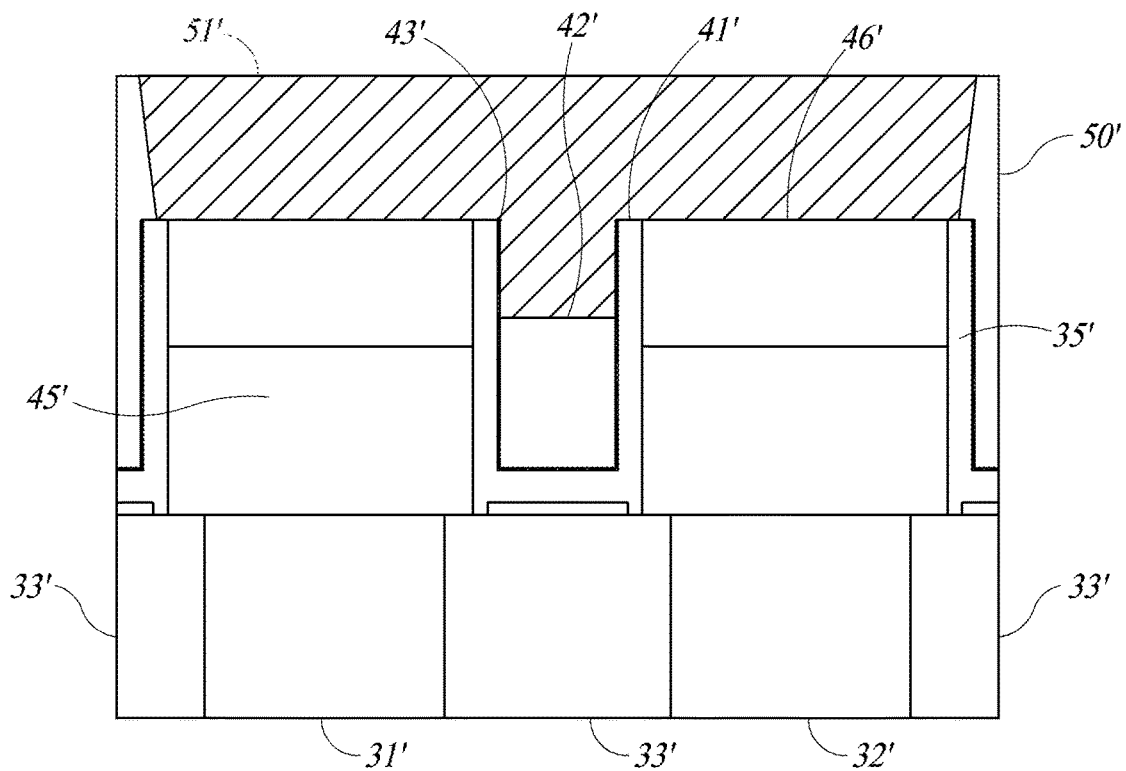

Continuing with this example, referring to FIGS. 25-27, the remaining portions of the sacrificial gate lines 30' above the active regions 31', 32' (which have served as a "dummy" gate up onto this point) and any underlying oxide may then be removed or etched away from above the active regions as shown. Replacement gates 45', such as high K metal gates, may then be formed over the active regions 31', 32', along with respective caps 46' (e.g., SiN), as seen in FIGS. 28-30. An oxide 50' deposition, followed by a self-aligned contact (SAC) etch to form source/drain contacts 51' (e.g., silicide, etc.), may then be performed to complete the semiconductor device 60' shown in FIGS. 31-34.

Thus, the above-described approaches provide for "cleaner" line ends which are less susceptible to shorting from epitaxial source/drain region deposition, for example. Moreover, the dielectric spacer provided over the STI regions and between the replacement gates may advantageously help provide desired isolation and leakage prevention characteristics, as will be appreciated by those skilled in the art.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A semiconductor device comprising:
   a substrate;
   first and second spaced apart semiconductor active regions;
   an insulating region in the substrate between the first and second semiconductor active regions in the substrate;
   a first gate above the first semiconductor active region;
   a second gate above the second semiconductor active region, an opening being between the first and second gates, aligned with and positioned over the insulating region;
   a dielectric body in the opening above the insulating region and including a different material than the insulating region; and
   a source and drain contact on the first and second gates and in the opening.

2. The semiconductor device of claim 1 wherein the dielectric body comprises a nitride.

3. The semiconductor device of claim 1 wherein the dielectric body comprises an outer liner comprising a nitride, an inner liner comprising a first oxide, and a second oxide within the inner liner different than the first oxide.

4. The semiconductor device of claim 3 wherein the first oxide comprises hafnium oxide, and wherein the second oxide comprises silicon dioxide.

5. The semiconductor device of claim 1 further comprising oxide regions adjacent the dielectric body above the insulating region.

6. The semiconductor device of claim 1 further comprising a respective plurality of epitaxial regions adjacent the first and second gates over the first and second semiconductor active regions.

7. The semiconductor device of claim 1 wherein the insulating region comprises a shallow trench isolation (STI) region.

8. A semiconductor device comprising:
a substrate;
first and second spaced apart semiconductor regions;
an insulating region in the substrate;
a first gate above the first semiconductor region;
a second gate above the second semiconductor region, an opening being aligned with and positioned over the insulating region;
a dielectric body in the opening above the insulating region and including a plurality of different materials, a top surface of the dielectric body being below a top surface of the second gate; and
a source and drain contact on the first and second gates and in the opening on the top surface of the dielectric body.

9. The semiconductor device of claim 8 wherein the plurality of different materials of said dielectric body comprises a nitride.

10. The semiconductor device of claim 8 wherein the plurality of different materials of said dielectric body comprises an outer liner comprising a nitride, an inner liner comprising a first oxide, and a second oxide within the inner liner different than the first oxide.

11. The semiconductor device of claim 10 wherein the first oxide comprises hafnium oxide, and wherein the second oxide comprises silicon dioxide.

12. The semiconductor device of claim 8 further comprising oxide regions adjacent the dielectric body above the insulating region.

13. The semiconductor device of claim 8 further comprising a respective plurality of epitaxial regions adjacent the first and second gates over the first and second semiconductor regions.

14. A semiconductor device comprising:
a substrate;
first and second spaced apart semiconductor regions on the substrate;
an insulating region between the first and second semiconductor regions;
a first gate on the first semiconductor region;
a second gate on the second semiconductor active region, the first gate being spaced from the second gate by an opening, the opening being aligned with and positioned on the insulating region;
a dielectric body partially filling the opening above the insulating region; and
a source and drain contact on the first and second gates and in the opening.

15. The semiconductor device of claim 14 wherein the dielectric body comprises an outer liner comprising a nitride, an inner liner comprising a first oxide, and a second oxide within the inner liner different than the first oxide.

16. The semiconductor device of claim 15 wherein the first oxide comprises hafnium oxide, and wherein the second oxide comprises silicon dioxide.

17. The semiconductor device of claim 14 further comprising oxide regions adjacent the dielectric body above the insulating region.

18. The semiconductor device of claim 14 further comprising a respective plurality of epitaxial regions adjacent the first and second gates over the first and second semiconductor active regions.

19. The semiconductor device of claim 14 wherein the insulating region comprises a shallow trench isolation region.

* * * * *